(12) United States Patent
Boisvert

(10) Patent No.: US 7,724,169 B2
(45) Date of Patent: May 25, 2010

(54) SEMICONDUCTOR CHIP WITH A NUMBER OF A/D CONVERTERS THAT INCLUDE A GROUP OF REDUNDANT A/D CONVERTERS

(75) Inventor: David Michael Boisvert, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 12/069,664

(22) Filed: Feb. 12, 2008

(65) Prior Publication Data

US 2009/0201188 A1 Aug. 13, 2009

(51) Int. Cl.
*H03M 1/00* (2006.01)

(52) U.S. Cl. .................. 341/141; 341/118; 341/120; 341/155; 341/159

(58) Field of Classification Search ......... 341/118–122, 341/139, 141, 142, 159
See application file for complete search history.

(56) References Cited

U.S. PATENT DOCUMENTS

| | | | | |
|---|---|---|---|---|
| 5,212,483 | A * | 5/1993 | Wakimoto | 341/141 |
| 5,274,593 | A | 12/1993 | Proebstring | 365/200 |
| 6,496,125 | B2 * | 12/2002 | Jonsson et al. | 341/118 |
| 7,049,984 | B2 * | 5/2006 | Wood et al. | 341/120 |
| 7,126,514 | B2 * | 10/2006 | Kohara | 341/141 |
| 7,126,515 | B1 * | 10/2006 | Kris | 341/141 |
| 7,227,479 | B1 * | 6/2007 | Chen et al. | 341/118 |
| 7,271,751 | B2 * | 9/2007 | Peterson et al. | 341/120 |
| 7,292,170 | B2 * | 11/2007 | Kinyua et al. | 341/141 |
| 7,319,422 | B2 * | 1/2008 | Ogawa | 341/155 |
| 7,405,684 | B2 * | 7/2008 | Kimura et al. | 341/141 |
| 7,411,538 | B1 * | 8/2008 | Piasecki | 341/161 |
| 7,420,498 | B2 * | 9/2008 | Barrenscheen | 341/155 |
| 7,446,690 | B2 * | 11/2008 | Kao | 341/155 |
| 2003/0001763 | A1 * | 1/2003 | Uda | 341/141 |
| 2006/0121858 | A1 * | 6/2006 | Tanaka et al. | 455/91 |

* cited by examiner

*Primary Examiner*—Linh V Nguyen
(74) *Attorney, Agent, or Firm*—Mark C. Pickering

(57) ABSTRACT

The manufacturing yield of an A/D converter semiconductor chip is significantly increased by utilizing a number of A/D converter circuits that include a group of redundant A/D converter circuits. As a result, the semiconductor chip can be wired to form a "good" A/D converter semiconductor chip as long as the number of "bad" A/D converter circuits does not exceed the number of redundant A/D converter circuits.

15 Claims, 7 Drawing Sheets

US 7,724,169 B2

SEMICONDUCTOR CHIP WITH A NUMBER OF A/D CONVERTERS THAT INCLUDE A GROUP OF REDUNDANT A/D CONVERTERS

BACKGROUND OF THE INVENTION

1. Field of the Invention

The present invention relates to A/D converters, and more particularly, to a semiconductor chip with a number of A/D converters that include a group of redundant A/D converters.

2. Description of the Related Art

Medical ultrasound devices commonly utilize a processing unit, a head that is passed over a region to be imaged, and a cable that connects the head to the processing unit. The head, in turn, typically includes a row of piezoelectric transducing elements that send ultrasonic vibrations into the region to be imaged, and receive ultrasonic vibrations back from the region after the vibrations have bounced off of internal structures within the region.

The clarity of an ultrasonic image is proportional to the number of piezoelectric transducing elements that are used in a row of transducing elements. As a result, the industry is moving to increase the number of piezoelectric transducing elements that are used in a row, along with increasing the number of rows of piezoelectric transducing elements that are used in a head.

One of the difficulties of increasing the number of piezoelectric transducing elements is that each piezoelectric transducing element has a corresponding signal processing path. Conventionally, the signal processing path includes a low noise amplifier (LNA), a variable gain amplifier (VGA), and an analog-to-digital (A/D) converter.

Thus, if an ultrasonic device includes 256 piezoelectric transducing elements in one or more rows, then the ultrasonic device also includes 256 LNAs, 256 VGAs, and 256 A/D converters that form 256 individual signal processing paths. 256 A/D converters, however, is a large number of A/D converters.

Current-generation devices aggregate eight A/D converters onto one semiconductor chip. However, one problem with aggregating A/D converters onto a single chip is that the manufacturing yield goes down as the number of A/D converters on a single chip goes up. This is because each A/D converter has a large number of parameters, such as signal-to-noise ratio, that must meet the requirements of a specification.

Thus, if any one of these parameters on any one of the A/D converters is out of range (fails to meet specification), then the entire chip must be discarded. For example, if a semiconductor chip has eight A/D converters that each has 10 specification parameters that must be met, then a failure in any one of the 80 parameters will cause the entire chip to be discarded. If 16 A/D converters were aggregated onto a single chip, then a failure in any one of the 160 parameters will cause the entire chip to be discarded.

Thus, as the number of aggregated A/D converters increases, the number of parameters increases which, in turn, increases the likelihood that one of the parameters will be out of range (fail to meet specification). As noted above, failure to meet one of the specification requirements causes the entire chip to be discarded, thereby reducing the manufacturing yield.

As a result, there is a need for an approach to aggregating a large number of A/D converters onto a single chip that substantially increases the manufacturing yield.

DETAILED DESCRIPTION OF THE INVENTION

Figure 1:
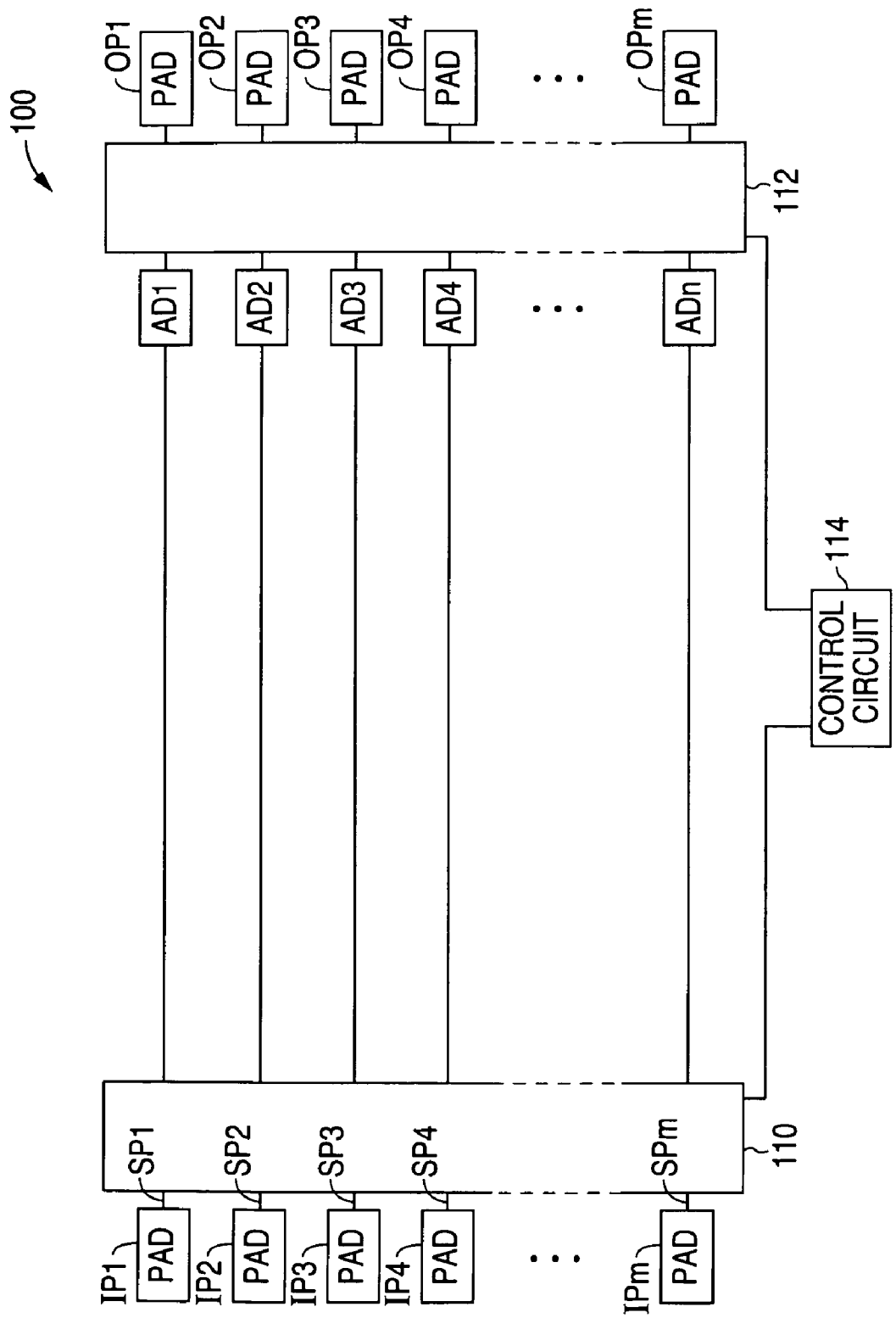
FIG. 1 is block diagram illustrating an example of a semiconductor chip 100 in accordance with the present invention.

FIG. 1 shows a block diagram that illustrates an example of a semiconductor chip 100 in accordance with the present invention. As described in greater detail below, semiconductor chip 100 includes a number of A/D converter circuits which, in turn, includes a group of redundant A/D converter circuits that allow the manufacturing yield to be substantially improved.

As shown in the FIG. 1 example, semiconductor chip 100 includes a number of A/D signal input pads IP1-IPm, such as 16 signal input pads, and an input switch circuit 110 that is connected to the A/D signal input pads IP1-IPm. The A/D signal input pads IP1-IPm provide points of external electrical signal input for chip 100.

Semiconductor chip 100 also includes a number of A/D converter circuits AD1-ADn, such as 18 A/D converter circuits, which are connected to input switch circuit 110. Input switch circuit 110, in turn, includes a number of switches that connect the A/D signal input pads IP1-IPm to the A/D converter circuits AD1-ADn.

Further, semiconductor chip 100 includes an output switch circuit 112 that is connected to the A/D converter circuits AD1-ADn, and a number of A/D signal output pads OP1-OPm, such as 16 signal output pads, that are connected to output switch circuit 112. Output switch circuit 112, in turn, includes a number of switches that connect the A/D converter circuits AD1-ADn to the A/D signal output pads OP1-OPm. The A/D signal output pads OP1-OPm provide points of external electrical signal output for chip 100.

In addition, semiconductor chip 100 includes a number of individual signal paths SP1-SPm. Each individual signal path SP extends from an A/D signal input pad IP through input switch circuit 110 through an A/D converter circuit AD through output switch circuit 112 to an A/D signal output pad OP.

In accordance with the present invention, the number of A/D converter circuits AD1-ADn is greater than the number of individual signal paths SP1-SPm by a value that defines a group of redundant A/D converter circuits. In other words, the value or the number of redundant A/D converter circuits in the group is defined as the number of A/D converter circuits that exceed the number of individual signal paths SP1-SPm (which is the same as the number of A/D signal input pads IP1-IPm and the number of A/D signal output pads OP1-OPm). For example, if 16 individual signal paths SP1-SP16 (which include 16 A/D signal input pads IP1-IP16 and 16 A/D signal output pads OP1-OP16) and 18 A/D converter circuits AD1-AD18 are present, then the 18 A/D converter circuits AD1-AD18 include 2 redundant A/D converter circuits.

Further, semiconductor chip 100 includes a control circuit 114 that is connected to the input and output switch circuits 110 and 112 to control the open and closed states of the switches in input switch circuit 110 and output switch circuit 112. During A/D converter testing, control circuit 114 temporarily closes and opens the switches in input switch circuit 110 and output switch circuit 112 to perform tests on the A/D converter circuits to determine which A/D converter circuits satisfy the specification requirements.

Following A/D converter circuit testing, if a sufficient number of "good" A/D converter circuits are present, control circuit 114 permanently closes and opens the switches in input switch circuit 110 and output switch circuit 112 so that each A/D signal input pad IP and each A/D signal output pad OP are connected to a good A/D converter circuit.

For example, when 16 individual signal paths (which include 16 A/D signal input pads IP1-IP16 and 16 A/D signal output pads OP1-OP16) and 16 "good" A/D converter circuits are present, control circuit 114 configures input switch circuit 110 and output switch circuit 112 so that the 16 "good" A/D converter circuits are electrically connected to the 16 input pads IP1-IP16 and the 16 output pads OP1-OP16 to form 16 "good" signal paths.

Figure 2:
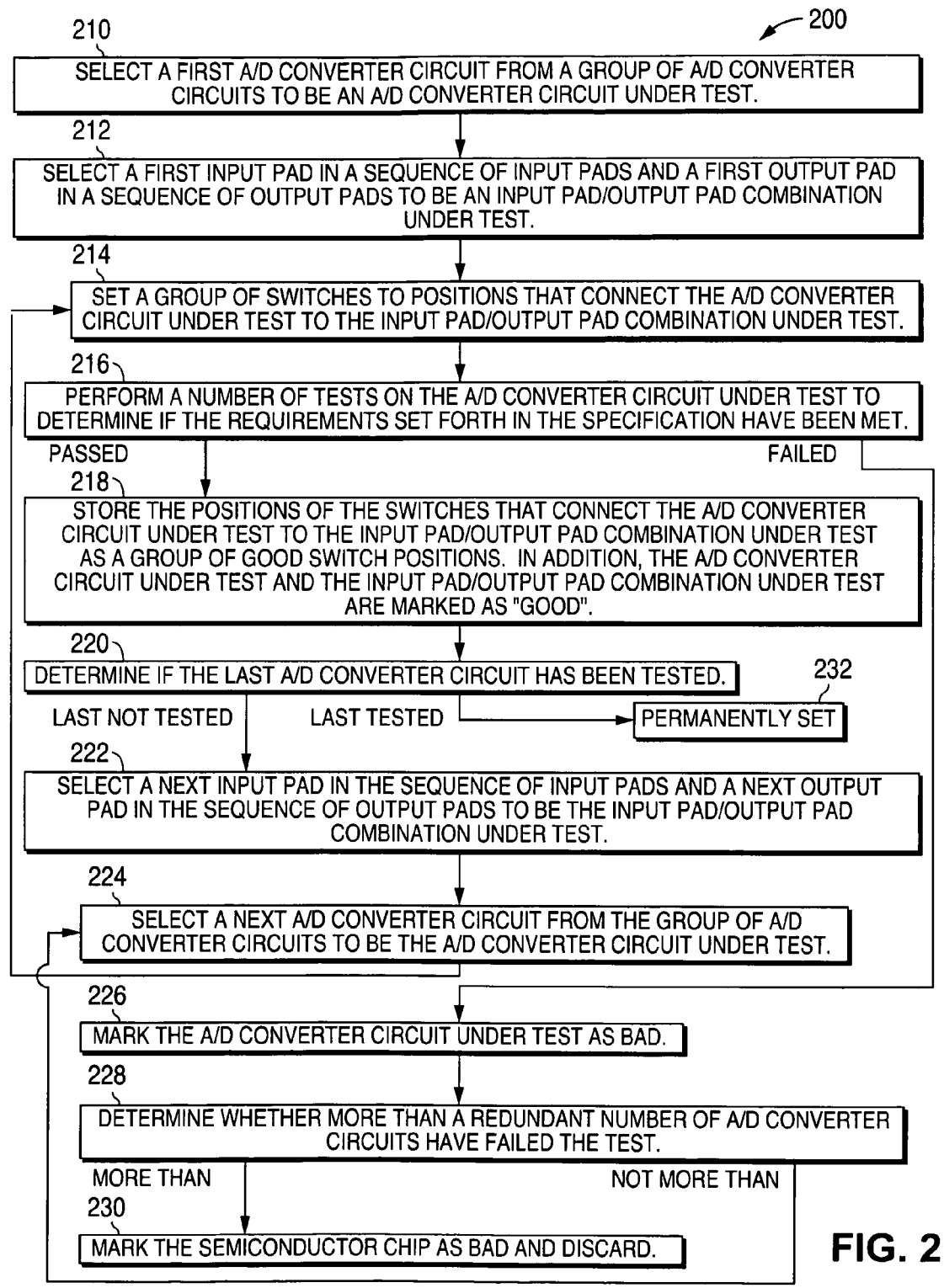
FIG. 2 is a flow chart illustrating an example of a method 200 of configuring a semiconductor chip in accordance with the present invention.

FIG. 2 shows a flow chart that illustrates an example of a method 200 of configuring a semiconductor chip in accordance with the present invention. As shown in FIG. 2, method 200 begins at 210 by selecting a first A/D converter circuit from a group of A/D converter circuits to be an A/D converter circuit under test. For example, A/D converter circuit AD1 of semiconductor chip 100 can be selected to be the A/D converter circuit under test.

Following this, method 200 moves to 212 to select a first signal input pad in a sequence of signal input pads and a first signal output pad in a sequence of signal output pads to be an input pad/output pad combination under test. For example, A/D signal input pad IP1 and A/D signal output pad OP1 can be selected to be the input pad/output pad combination under test.

Method 200 next moves to 214 to set a group of switches to positions that connect the A/D converter circuit under test to the input pad/output pad combination under test. For example, the switches in the input and output switch circuits 110 and 112 can be set to connect A/D converter circuit AD1 to the signal input and output pads IP1 and OP1. After this, method 200 moves to 216 to perform a number of tests on the A/D converter circuit under test to determine if the A/D converter circuit under test meets the requirements set forth in the specification.

Testing is conventionally performed by placing a known series of signals and voltages on the input pads of the A/D converter circuit under test, measuring the signals and/or voltages generated on the output pads of the A/D converter circuit under test in response to the signals and voltages on the input pads, and comparing the measured values against a range of good values.

Once the tests have been completed, if the A/D converter circuit under test passed all of the tests, method 200 moves to 218 to store the positions of the switches that connect the A/D converter circuit under test to the input pad/output pad combination under test as a group of good switch positions. In addition, the A/D converter circuit under test and the input pad/output pad combination under test are marked as "good."

Following this, method 200 moves to 220 to determine if the last A/D converter circuit has been tested. If the last A/D converter circuit has not been tested, then method 200 moves to 222 to select a next input pad in the sequence of input pads and a next output pad in the sequence of output pads to be the input pad/output pad combination under test. For example, A/D signal input pad IP2 and A/D signal output pad OP2 can be selected to be the next input pad/output pad combination under test.

After this, method moves to 224 to select a next A/D converter circuit from the group of converter circuits to be the A/D converter circuit under test. For example, A/D converter circuit AD2 can be selected to be the next A/D converter circuit under test. Following this, method 200 returns to 214 to again set the switches.

If at 216 the A/D converter circuit under test failed a test, method 200 moves to 226 where the A/D converter circuit under test is marked as bad. After marking the A/D converter circuit under test as bad, method 200 moves to 228 to determine whether more than a redundant number of A/D converter circuits has failed the test.

For example, if A/D converter circuit AD1 of semiconductor chip 100 fails a test, A/D converter circuit AD1 is marked as bad. If more than a redundant number of A/D converter circuits have failed a test, then method 200 moves to 230 where the semiconductor chip is marked as bad and discarded.

However, if two redundant A/D converter circuits are present in the current example, then more than the redundant number of A/D converter circuits has not failed a test at this point. If more than the redundant number of A/D converter circuits has not failed a test, then method 200 moves to 224 to select an A/D converter circuit from the group to be the next A/D converter circuit under test.

The next A/D converter circuit under test can be selected to be the next A/D converter circuit in the sequence. For example, A/D converter circuit AD2 can be selected to be the next A/D converter circuit under test. Alternately, the next A/D converter circuit under test can be selected from a special subgroup of redundant A/D converter circuits. For example, if A/D converter circuits ADm and ADm-1 are the two redundant A/D converter circuits that are present and the A/D converter circuit under test fails a test, then the next A/D converter circuit under test can be selected from the two redundant A/D converter circuits ADm and ADm-1.

In either case, A/D signal input pad IP1 and A/D signal output pad OP1 continue to be the input pad/output pad combination under test. Following this, method 200 returns to 214 to again set the switches to connect the A/D converter circuit under test to the input pad/output pad combination under test.

If the last A/D converter circuit has been tested in 220, then method 200 moves to 232 to permanently set each group of good switch positions. The last A/D converter circuit has been tested when the number of "good" A/D converter circuits is equal to the number of individual signal paths SP1-SPm (which include the number of A/D signal input pads IP1-IPm and the number of A/D signal output pads OP1-OPm).

For example, 16 individual signal paths SP1-SP16 (which include 16 A/D signal input pads IP1-IP16 and 16 A/D signal output pads OP1-OPm) require 16 "good" A/D converters circuits. Thus, if the first 16 A/D converter circuits AD1-AD16 that are tested are good, then the $16^{th}$ A/D converter circuit is the last A/D converter circuit to be tested as there is no need to test any of the remaining A/D converter circuits.

In addition, each group of good switch positions can be permanently set using any one of a number of conventional approaches. For example, control circuit 114 can include an EEPROM that controls the open/closed state of each switch in the input and output switch circuits 110 and 112. In this example, the EEPROM is programmed following the final test to define the permanent positions of the switches in the input and output switch circuits 110 and 112. In addition, fuses and wire bonding are other well-known approaches to making a permanent connection.

Thus, in the present invention, since the A/D converter circuits in a semiconductor chip include redundant A/D converter circuits, the semiconductor chip can be wired to form a "good" semiconductor chip as long as the number of "bad" A/D converter circuits does not exceed the number of redundant A/D converter circuits. This, in turn, significantly increases the manufacturing yield.

Figure 3:
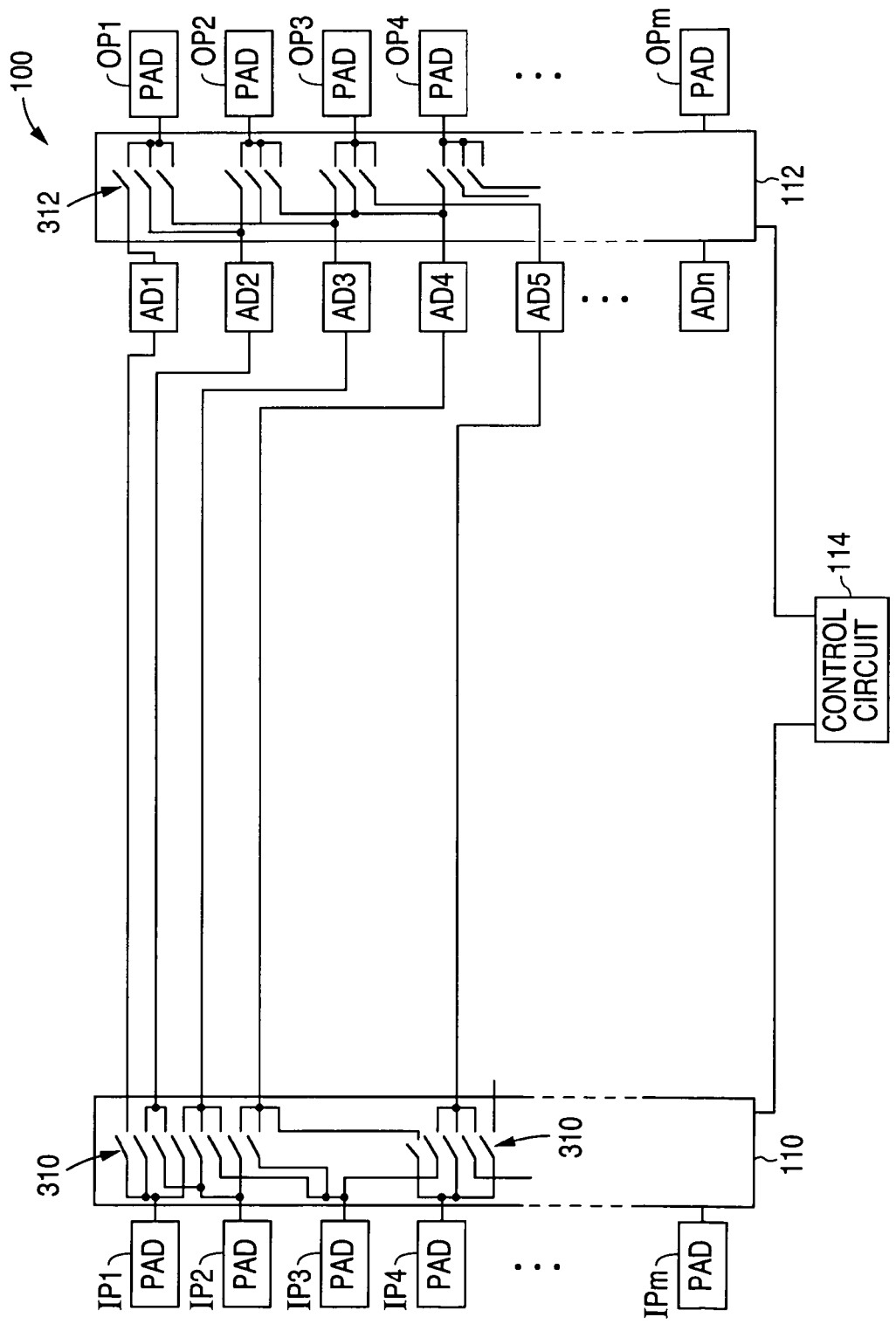
FIG. 3 is a block diagram further illustrating an example of the input and output switch circuits 110 and 112 of semiconductor chip 100 in accordance with the present invention.

FIG. 3 shows a block diagram that further illustrates an example of the input and output switch circuits 110 and 112 of semiconductor chip 100 in accordance with the present invention. As shown in FIG. 3, switch circuit 110 includes a number of switches 310 that are connected together to allow each A/D signal input pad IP1-IPm to be connected to an A/D converter circuit AD1-ADn with a matching rank, and also be connected to one or more additional A/D converter circuits AD1-ADn with a next in sequence rank.

The number of additional A/D converter circuits that are switchably connected to each A/D signal input pad IP1-IPm is defined by the number of redundant A/D converter circuits that have been included. Thus, if two redundant A/D converter circuits have been included, then each A/D signal input pad IP1-IPm is switchably connected to an A/D converter circuit AD1-ADn with a matching rank, and also switchably connected to the next two A/D converter circuits in sequence rank.

For example, the first A/D signal input pad IP1 is switchably connected to the first A/D converter circuit AD1 because of the matching rank (first), and switchably connected to the next two A/D converter circuits in sequence rank, namely the second and third A/D converter circuits AD2 and AD3. Similarly, a second A/D signal input pad IP2 is switchably connected to the second A/D converter circuit AD2 because of the matching rank (second), and switchably connected to the next two A/D converter circuits in sequence rank, namely the third and fourth A/D converter circuits AD3 and AD4. Further, a third A/D signal input pad IP3 is switchably connected to the third A/D converter circuit AD3 because of the matching rank (third), and switchably connected to the next two A/D converter circuits in sequence rank, namely the fourth and fifth A/D converter circuits AD4 and AD5.

Alternately, the last A/D signal input pad IPm can be switchably connected to the last A/D converter circuit ADm because of the matching rank (last), and switchably connected to the next two A/D converter circuits in sequence rank, namely the fourth and third A/D converter circuits AD4 and AD3. Similarly, a next to last A/D signal input pad IP4 can be switchably connected to the fourth A/D converter circuit AD4 because of the matching rank (fourth), and switchably connected to the next two A/D converter circuits in sequence rank, namely the third and second A/D converter circuits AD3 and AD2. Further, a third A/D signal input pad IP3 is switchably connected to the third A/D converter circuit AD3 because of the matching rank (third), and switchably connected to the next two A/D converter circuits in sequence rank, namely the second and first A/D converter circuits AD2 and AD1.

As further shown in FIG. 3, switch circuit 112 includes a number of switches 312 that allow each A/D signal output pad OP1-OPm to be connected to an A/D converter circuit AD1-ADn with a matching rank, and also be connected to one or more additional A/D converter circuits AD1-ADn with a next in sequence rank.

The number of additional A/D converter circuits that are switchably connected to each A/D signal output pad OP1-OPm is defined by the number of redundant A/D converter circuits that have been included. Thus, if two redundant A/D converter circuits have been included, then each A/D signal output pad OP1-OPm is switchably connected to an A/D converter circuit AD1-ADn with a matching rank, and also switchably connected to the next two A/D converter circuits AD1-ADn in sequence rank.

For example, as shown in FIG. 3, the first A/D signal output pad OP1 is switchably connected to the first A/D converter circuit AD1 because of the matching rank (first), and switchably connected to the next two A/D converter circuits in sequence rank, namely the second and third A/D converter circuits AD2 and AD3. Similarly, a second A/D signal output pad OP2 is switchably connected to the second A/D converter circuit AD2 because of the matching rank (second), and switchably connected to the next two A/D converter circuits in sequence rank, namely the third and fourth A/D converter circuits AD3 and AD4. Further, a third A/D signal output pad OP3 is switchably connected to the third A/D converter circuit AD3 because of the matching rank (third), and switchably connected to the next two A/D converter circuits in sequence rank, namely the fourth and fifth A/D converter circuits AD4 and AD5.

Alternately, the last A/D signal output pad OPm can be switchably connected to the last A/D converter circuit ADm because of the matching rank (last), and switchably connected to the next two A/D converter circuits in sequence rank, namely the fourth and third A/D converter circuits AD4 and AD3. Similarly, a next to last A/D signal output pad OP4 can be switchably connected to the fourth A/D converter circuit AD4 because of the matching rank (fourth), and switchably connected to the next two A/D converter circuits in sequence rank, namely the third and second A/D converter circuits AD3 and AD2. Further, a third A/D signal output pad OP3 is switchably connected to the third A/D converter circuit AD3 because of the matching rank (third), and switchably connected to the next two A/D converter circuits in sequence rank, namely the second and first A/D converter circuits AD2 and AD1.

Figure 4:
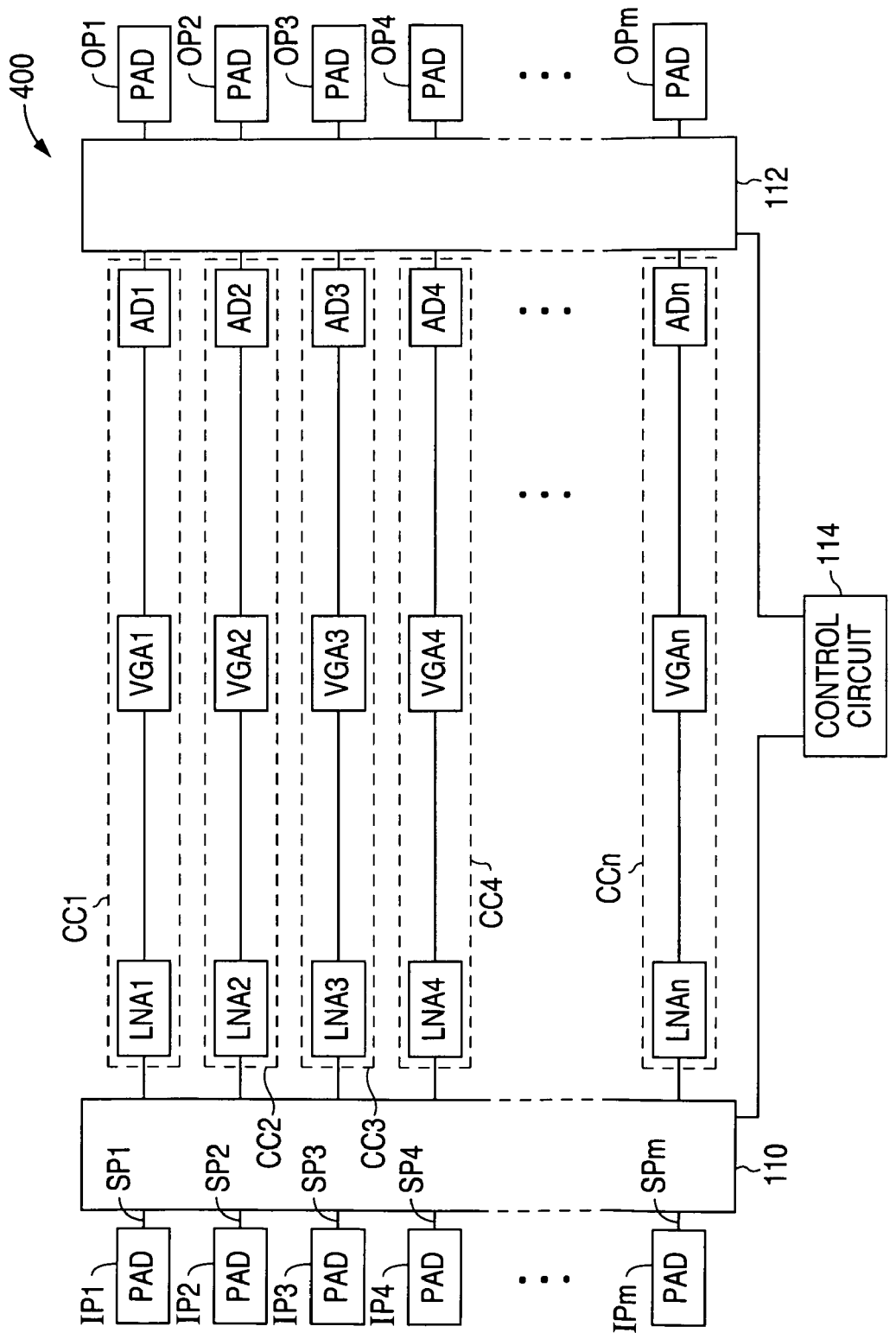
FIG. 4 is a block diagram illustrating an example of a semiconductor chip 400 in accordance with the present invention.

FIG. 4 shows a block diagram that illustrates an example of a semiconductor chip 400 in accordance with the present invention. Semiconductor chip 400 is similar to semiconductor chip 100 shown in FIGS. 1 and 3 and, as a result, utilizes the same reference numerals to designate the structures which are common to both chips.

As shown in FIG. 4, chip 400 differs from chip 100 in that chip 400 additionally includes a number of low noise amplifiers LNA1-LNAn that are connected to input switch circuit 110, and a number of variable gain amplifiers VGA1-VGAn that are connected to the low noise amplifiers LNA1-LNAn and the A/D converter circuits AD1-ADn. Each A/D converter circuit AD1-ADn can optionally include an anti-aliasing filter that is connected between a variable gain amplifier and an A/D converter.

As a result, each signal processing path SP in chip 400 extends from an A/D signal input pad IP through input switch circuit 110 through a low noise amplifier LNA through a variable gain amplifier VGA through an A/D converter circuit AD through output switch circuit 112 to an A/D signal output pad OP.

Thus, while semiconductor chip 100 has a number of A/D converter circuits AD1-ADn, semiconductor chip 400 has a number of conversion circuits CC1-CCn where each conversion circuit CC includes a low noise amplifier LNA, a variable gain amplifier VGA, and an A/D converter circuit AD.

Semiconductor chip 400 operates in the same manner as semiconductor chip 100 except that a conversion circuit CC is tested with semiconductor chip 400 instead of a single A/D converter circuit AD as with semiconductor chip 100. As a result, method 200 also applies to semiconductor chip 400.

Figure 5:
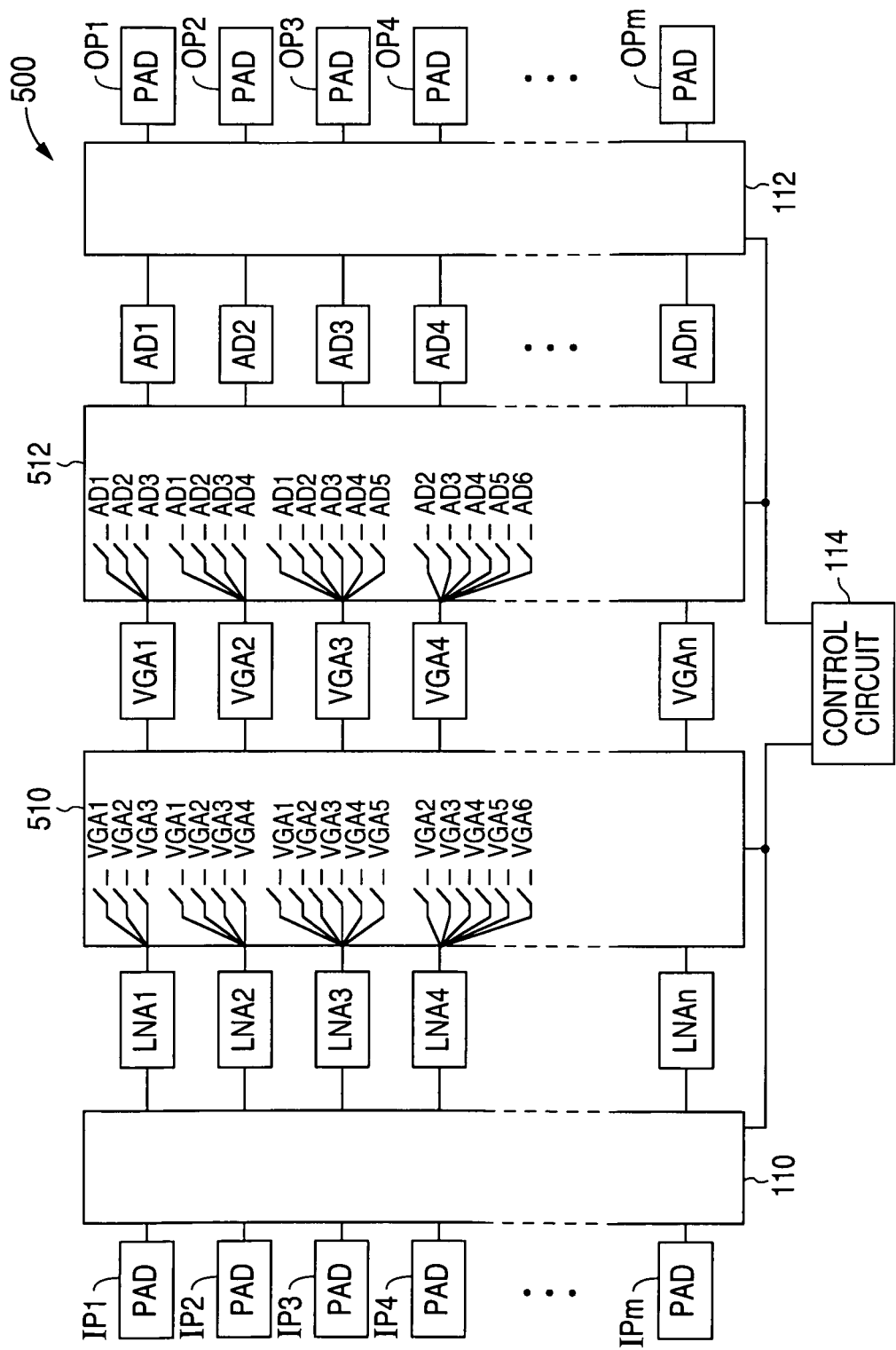
FIG. 5 is a block diagram illustrating an example of a semiconductor chip 500 in accordance with the present invention.

FIG. 5 shows a block diagram that illustrates an example of a semiconductor chip 500 in accordance with the present invention. Semiconductor chip 500 is similar to semiconductor chip 400 and, as a result, utilizes the same reference numerals to designate the structures which are common to both chips.

As shown in FIG. 5, chip 500 differs from chip 400 in that chip 500 includes a first intermediate switch circuit 510 that is connected to the low noise amplifiers LNA1-LNAn and the variable gain amplifiers VGA1-VGAn, and a second intermediate switch circuit 512 that is connected to the variable gain amplifiers VGA1-VGAn and the A/D converter circuits AD1-ADn.

In the FIG. 5 example, switch circuit 510 allows LNA1 to be connected to VGA1, VGA2, or VGA3, while LNA2 can be connected to VGA1, VGA2, VGA3, or VGA4, and LNA3 can be connected to VGA1, VGA2, VGA3, VGA4, or VGA5. Similarly, switch circuit 512 allows VGA1 to be connected to AD1, AD2, or AD3, while VGA2 can be connected to AD1, AD2, AD3, or AD4, and VGA3 can be connected to AD1, AD2, AD3, AD4, or AD5.

Semiconductor chip 500 can be tested in a variety of ways by closing and opening the switches in the switch circuits 110, 112, 510, and 512. For example, semiconductor chip 500 can be initially tested in the same way that semiconductor chip 400 is tested, with each test of an A/D converter circuit also testing a LNA and a VGA. Following this, the switches can be configured to isolate a failed device.

For example, assume that a signal processing path SP from input pad IP1 through input switch 110 through LNA1 through first intermediate switch circuit 510 through VGA1 through second intermediate switch circuit 512 through AD1 through output switch 112 to output pad OP1 does not pass a test, but a signal processing path SP from input pad IP2 through input switch 110 through LNA2 through first intermediate switch circuit 510 through VGA2 through second intermediate switch circuit 512 through AD2 through output switch 112 to output pad OP2 does pass the tests.

In this case, the switches can be set to isolate the failing device. For example, a signal processing path SP from input pad IP2 through input switch 110 through LNA1 through first intermediate switch circuit 510 through VGA2 through second intermediate switch circuit 512 through AD2 through output switch 112 to output pad OP2 allows low noise amplifier LNA1 to be individually tested.

Figure 6:
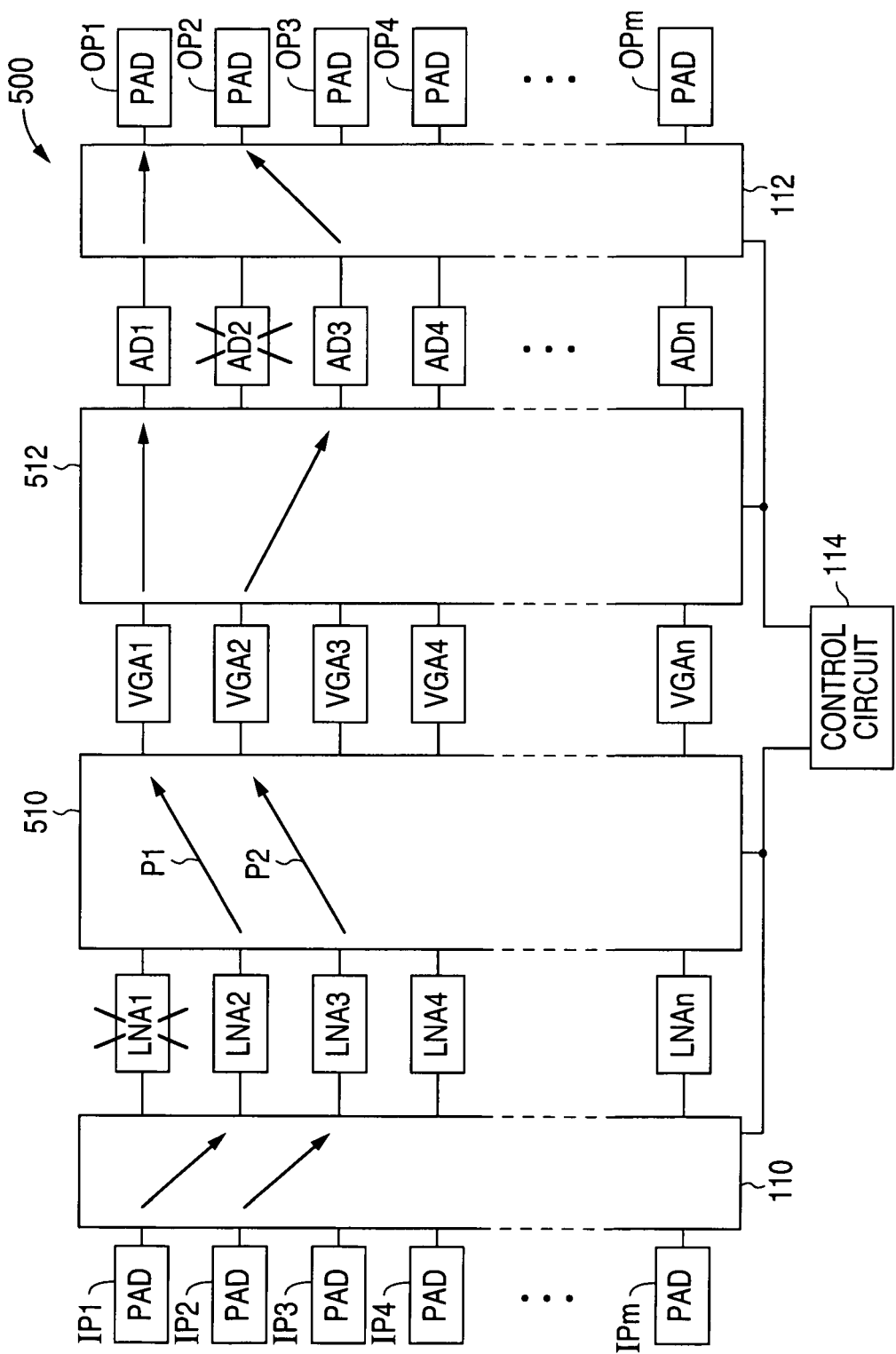
FIG. 6 is a block diagram of semiconductor chip 500 illustrating the operation of semiconductor chip 500 in accordance with the present invention.

FIG. 6 shows a block diagram of semiconductor chip 500 that illustrates the operation of semiconductor chip 500 in accordance with the present invention. When the testing is complete, control circuit 114 is aware of all of the devices that failed a test, i.e., control circuit 114 is aware of each low noise amplifier LNA1-LNAn, each variable gain amplifier VGA1-VGAn, and each A/D converter circuit AD1-ADn that failed a test.

As illustrated in the FIG. 6 example, assume that low noise amplifier LNA1 tested as "bad," while the remaining low noise amplifiers LNA2-LNAn tested as "good." In addition, assume that all of the variable gain amplifiers VGA1-VGAn tested as "good." Further, assume that A/D converter circuits AD1 and AD3-ADn tested as "good," while A/D converter circuit AD2 tested as bad.

In operation, control circuit 114 permanently closes the switches that connect the first signal input pad IP1 to the first "good" low noise amplifier, to the first "good" variable gain amplifier, to the first "good" A/D converter circuit, to the first signal output pad OP1. In the FIG. 6 example, since low noise amplifier LNA1 is "bad," control circuit 114 permanently connects the first signal input pad IP1 to the second low noise amplifier LNA2.

However, since the first variable gain amplifier VGA1 is "good," the second low noise amplifier LNA2 is connected to the first variable gain amplifier VGA1. Similarly, since the first A/D converter circuit AD1 is "good," the first A/D converter circuit AD1 is connected to the first variable gain amplifier VGA1, and the first signal output pad OP1 is connected to the first A/D converter circuit AD1 to form a first signal processing path.

Following this, control circuit 114 permanently closes the switches that connect the next signal input pad IP to the next "good" low noise amplifier, to the next "good" variable gain amplifier, the next "good" A/D converter circuit AD, to the next signal output pad OP.

In the FIG. 6 example, since the next "good" low noise amplifier is low noise amplifier LNA3, control circuit 114 permanently connects the next signal input pad IP2 to the third low noise amplifier LNA3. However, since the next "good" variable gain amplifier is variable gain amplifier VGA2, control circuit 114 permanently connects low noise amplifier LNA3 to variable gain amplifier VGA2. In addition, since the next "good" A/D converter circuit is A/D converter circuit AD3, control circuit 114 permanently connects variable gain amplifier VGA2 to A/D converter circuit AD3, which is connected to next signal output pad OP2.

The advantage of semiconductor chip 600 is illustrated in FIG. 6. As shown, two signal processing paths P1 and P2 utilize devices from three rows of signal processing devices. Thus, even though two devices from two separate rows of signal processing devices are "bad," only one redundant row is lost.

In other words, if low noise amplifier LNA1 of semiconductor chip 400 were "bad," then the entire row of devices is considered "bad" which, in turn, leads to the loss of a first redundant row of devices. If A/D converter circuit AD2 of semiconductor chip 400 were "bad," then the entire row of devices is also considered "bad" which, in turn, leads to the loss of a second redundant row of devices.

However, with semiconductor chip 600, when low noise amplifier LNA1 and A/D converter circuit AD2 are "bad," only one redundant row of devices is lost because one signal processing path uses the devices from both rows of devices. Thus, in accordance with the present invention, a semiconductor chip with a number of A/D converter circuits that include a group of redundant A/D converter circuits has been described. Using redundant A/D converter circuits, in turn, allows chips with "bad" devices to be connected together as a "good" chip, thereby substantially improving the manufacturing yield.

Figure 7:
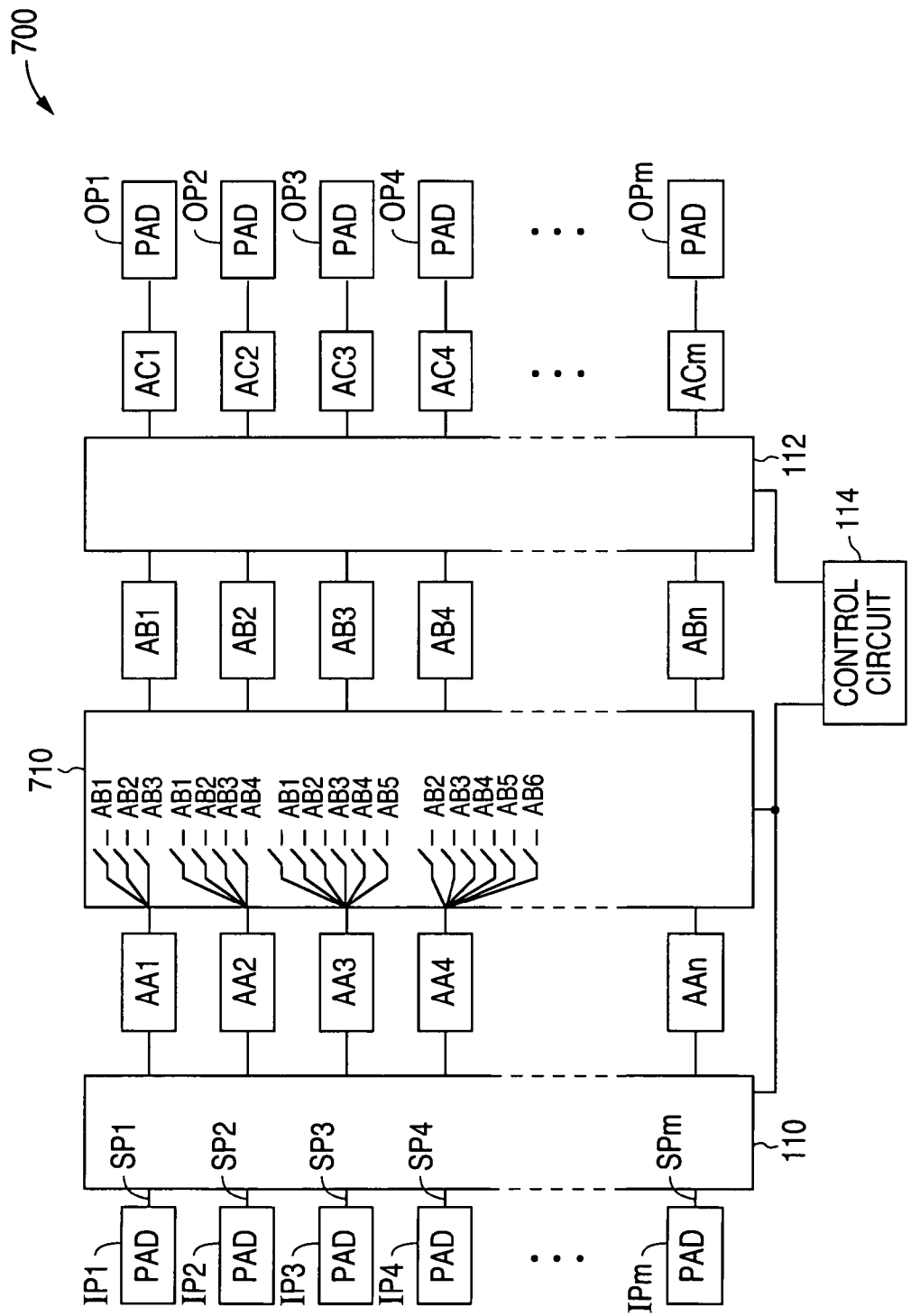
FIG. 7 is a block diagram of a semiconductor chip 700 illustrating an example of a semiconductor chip 700 in accordance with the present invention.

FIG. 7 shows a block diagram that illustrates an example of a semiconductor chip 700 in accordance with the present invention. Semiconductor chip 700 is similar to semiconductor chip 100 and, as a result, utilizes the same reference numerals to designate the structures which are common to both chips.

Chip 700 differs from chip 100 in that the A/D converters in chip 700 have been broken into groups of converter stages that include critical stages most likely to fail and stages less likely to fail. In the FIG. 7 example, three groups of converter stages AA1-AAn, AB1-ABn, and AC1-ACm are illustrated, although any number of converter stages can be used. For example, the first stage of an A/D converter can be a sample and hold circuit, the second stage of the A/D converter can be a course bank, and the third stage can be the remaining circuitry of the A/D converter. Alternately, the stages can be the different stages of a pipelined converter.

Further, in the present example, the last group of converter stages AC1-ACm, which is least likely to fail, is formed to have the same number of elements as the signal paths SP1-SPm and the pads IP1-IPm and OP1-OPm, and thus provides no redundancy. The first two stage groups AA1-AAn and AB1-ABn, on the other hand, have additional elements and thus provide redundancy.

Chip 700 also differs from chip 100 in that chip 700 includes a switch circuit 710 that is connected to the first converter stages AA1-AAn and the second converter stages AB1-ABn. Switch circuit 710, which can be implemented with switch 510, allows AA1 to be connected to AB1, AB2, or AB33, while AA2 can be connected to AB1, AB2, AB3, or AB4, and AA3 can be connected to AB1, AB2, AB3, AB4, or AB5. Further, the first converter stages AA1-AAn are connected to input switch circuit 110 in the same manner that A/D converters AD1-ADn of chip 100 are connected to input pads IP1-IPm, and the second converter stages AB1-ABn are connected to the third converter stages AC1-ACm in the same manner that A/D converters AD1-ADn of chip 100 are connected to output pads OP1-OPm.

Semiconductor chip 700 can be tested in a variety of ways by closing and opening the switches in the switch circuits 110, 112, and 710. For example, semiconductor chip 700 can be initially tested in the same way that semiconductor chip 500 is tested, with each test of a first stage circuit AA also testing a second stage AB and a third stage AC. Following this, the switches can be configured to isolate a failed device.

For example, assume that a signal processing path SP from input pad IP1 through input switch 110 through AA1 through switch circuit 710 through AB1 through output switch 112 through AC1 to output pad OP1 does not pass a test, but a signal processing path SP from input pad IP2 through input switch 110 through AA2 through switch circuit 710 through AB2 through output switch 112 through AC2 to output pad OP2 does pass the tests.

In this case, the switches can be set to isolate the failing device. For example, a signal processing path SP from input pad IP2 through input switch 110 through AA1 through switch circuit 710 through AB2 through output switch 112 through AC2 to output pad OP2 allows the first stage AA1 to be individually tested.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A semiconductor chip comprising:
   a plurality of input nodes;
   a number of analog-to-digital (A/D) converter circuits, the number of A/D converter circuits being greater than the plurality of input nodes;
   an input switch circuit connected to the plurality of input nodes and the number of A/D converter circuits, the input switch circuit having a plurality of switchable electrical connections to switchably connect the plurality of input nodes to the number of A/D converter circuits so that each input node is switchably connected to a plurality of A/D converter circuits of the number of A/D converter circuits, and permanently electrically connect each input node to a different A/D converter circuit so that each input node is permanently electrically connected to only one A/D converter circuit.

2. The semiconductor chip of claim 1 wherein the plurality of A/D converter circuits is less than the number of A/D converter circuits.

3. The semiconductor chip of claim 2 wherein each input node is connected to a different combination of A/D converter circuits of the number of A/D converter circuits.

4. The semiconductor chip of claim 3 wherein each A/D converter circuit includes an A/D converter and a variable gain amplifier connected to the A/D converter.

5. The semiconductor chip of claim 3 wherein each A/D converter circuit includes an A/D converter, a variable gain amplifier connected to the A/D converter, and a low noise amplifier connected to the variable gain amplifier.

6. A semiconductor chip comprising:
   a plurality of input nodes;
   an analog-to-digital (A/D) circuit, the A/D circuit having a number of A/D converter circuits, the number of A/D converter circuits being greater than the plurality of input nodes;
   an input switch circuit connected to the plurality of input nodes and electrically connected to the A/D circuit, the input switch circuit having a plurality of switchable electrical connections to switchably electrically connect the plurality of input nodes to the A/D circuit so that each input node is switchably electrically connected to a plurality of A/D converter circuits of the number of A/D converter circuits, and permanently electrically connect each input node to a different A/D converter circuit so that each input node is permanently electrically connected to only one A/D converter circuit.

7. The semiconductor chip of claim 6 wherein the plurality of A/D converter circuits is less than the number of A/D converters.

8. The semiconductor chip of claim 7 wherein each input node is connected to a different combination of A/D converter circuits of the number of A/D converters.

9. The semiconductor chip of claim 8 wherein each A/D converter circuit includes an A/D converter and a variable gain amplifier connected to the A/D converter.

10. The semiconductor chip of claim 6 wherein the A/D circuit further includes:
    a number of electrical circuits connected to the input switch circuit; and
    an intermediate switch circuit connected to the number of electrical circuits and electrically connected the number of A/D converter circuits.

11. The semiconductor chip of claim 10 wherein the number of electrical circuits are amplifiers.

12. The semiconductor chip of claim 10 wherein the number of electrical circuits are A/D conversion circuits.

13. A semiconductor chip comprising:

a plurality of input nodes;

a number of analog-to-digital (A/D) converter circuits;

an input switch circuit connected to the plurality of input nodes and the number of A/D converter circuits, the input switch circuit having a plurality of switchable electrical connections to switchably connect the plurality of input nodes to the number of A/D converter circuits so that each input node is switchably connected to a plurality of A/D converter circuits of the number of A/D converter circuits, the input switch circuit having no switchable electrical connection from each input node to an A/D converter circuit of the number of A/D converter circuits.

14. The semiconductor chip of claim 13 wherein the plurality of A/D converter circuits is greater than the plurality of input nodes.

15. The semiconductor chip of claim 14 wherein each input node is connected to a different combination of A/D converter circuits of the number of A/D converter circuits.

* * * * *